United States Patent
Behrens et al.

(10) Patent No.: US 8,053,672 B2
(45) Date of Patent: Nov. 8, 2011

(54) METHOD AND APPARATUS FOR HIGH-DENSITY POWER DISTRIBUTION UNIT WITH INTEGRATED CABLE MANAGEMENT

(75) Inventors: Edward Behrens, Hopkinton, MA (US); Tho Tu, Laguna Niguel, CA (US); David Wang, San Jose, CA (US)

(73) Assignee: Chatsworth Products, Inc., Georgetown, TX (US)

( * ) Notice: Subject to any disclaimer, the term of this patent is extended or adjusted under 35 U.S.C. 154(b) by 0 days.

(21) Appl. No.: 13/020,677

(22) Filed: Feb. 3, 2011

(65) Prior Publication Data

US 2011/0120765 A1 May 26, 2011

Related U.S. Application Data

(63) Continuation of application No. 12/475,144, filed on May 29, 2009, now Pat. No. 7,910,830.

(60) Provisional application No. 61/057,431, filed on May 30, 2008.

(51) Int. Cl.
*H02G 3/04* (2006.01)

(52) U.S. Cl. ........................................ 174/72 A

(58) Field of Classification Search ............... 174/72 A; 439/215, 211, 540.1
See application file for complete search history.

(56) References Cited

U.S. PATENT DOCUMENTS

| | | | |
|---|---|---|---|
| 5,726,866 | A | 3/1998 | Allen |
| 5,831,211 | A | 11/1998 | Gartung et al. |
| 6,011,221 | A | 1/2000 | Lecinski et al. |
| 6,245,998 | B1 | 6/2001 | Curry et al. |
| 6,609,034 | B1 | 8/2003 | Behrens et al. |
| 7,356,924 | B2 | 4/2008 | Johnson et al. |
| 7,910,830 | B2 * | 3/2011 | Behrens et al. ............ 174/72 A |
| 7,910,831 | B2 * | 3/2011 | Behrens et al. ............ 174/72 A |

* cited by examiner

*Primary Examiner* — Javaid Nasri
(74) *Attorney, Agent, or Firm* — Snell & Wilmer, L.L.P.

(57) ABSTRACT

A cable management unit having a base section and a top section, the base section and the top section defining a space therebetween, a plurality of distribution walls coupled between the base section and the top section and having a front surface facing the space and a back surface facing away from the space, an electronic device disposed within the space, and a plurality of ports disposed on the back surface of the contiguous section of the plurality of distribution walls and each having a port surface extending beyond the back surface of the contiguous section.

20 Claims, 7 Drawing Sheets

US 8,053,672 B2

METHOD AND APPARATUS FOR HIGH-DENSITY POWER DISTRIBUTION UNIT WITH INTEGRATED CABLE MANAGEMENT

CROSS REFERENCE TO RELATED APPLICATIONS

This application is a continuation of U.S. patent application Ser. No. 12/475,144, entitled "METHOD AND APPARATUS FOR HIGH-DENSITY POWER DISTRIBUTION UNIT WITH INTEGRATED CABLE MANAGEMENT," filed on May 29, 2009, now U.S. Pat. No. 7,910,830, which claims the benefit of U.S. Provisional Patent Application No. 61/057,431, filed on May 30, 2008. The entire disclosures of each of these applications are hereby incorporated by reference herein.

BACKGROUND

1. Field of Invention

The disclosure relates to providing a high-density power distribution unit with an integrated cable management. More specifically, the disclosure relates to a novel power distribution unit enabling multiple cables to be received at one unit with minimal cable interference.

2. Description of Related Art

In a conventional power distribution unit, input receptacles are located in the front and rear faces of the conventional power distribution unit because there often is an inadequate amount of space in the rear of the conventional power distribution unit to handle all of the input receptacles.

For example, the conventional 1 U power distribution unit may not have enough space to have 24 receptacles in the rear for 24 cables. However, by having the cables plugged into the front and the rear of the conventional power distribution unit, the cables in the front of the conventional power distribution unit need to be routed to the rear of the power distribution unit for connection to the power supplies or other components. This could cause problems with the cable lengths, access, airflow, tangling, or dislodging of the connections between the cables and the ports.

Therefore, there is a need for a method and apparatus to provide a high-density power distribution unit with improved cable management ability.

SUMMARY

In one embodiment, the disclosure relates to a cable management unit having a base section for supporting a plurality of distribution walls. The distribution walls support several ports and can form a contiguous section or several discontinuous segments. A first mounting bracket and a second mounting bracket are integrated with the base section for securing the base to a receiving structure. Some of the distribution walls can be arranged at an angle with relation to each other in order to expand the number of ports that are formed on the base.

In another embodiment, the disclosure relates to a power distribution system formed by a housing having a base section, a top section and three side sections; a plurality of ports interposed between the base section and the top section, the plurality of ports adapted to receive one or more connections; and a mounting bracket for mounting the power distribution system to a structure. The ports can be arranged on the base to form a geometric shape having a plurality of sides and at least one angle separating two of the adjacent sides. In a related embodiment, the ports are arranged on the base such that the face of each port is substantially parallel to an edge of the base section.

In still another embodiment, the disclosure relates to a power distribution system formed by a housing having a base section, a top section and three side sections; a plurality of ports interposed between the base section and the top section, the plurality of ports adapted to receive one or more connections; and a mounting bracket for mounting the power distribution system to a structure. The plurality of ports can be arranged on the base to form a geometric shape having a plurality of sides and at least one angle separating two of the adjacent sides.

The disclosed embodiments can be used as part of a power distribution or data distribution rack. The disclosed embodiments can also include one or more processor circuits in communication with a memory circuit for controlling the input/output of each power distribution or data distribution unit or for the entire rack.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
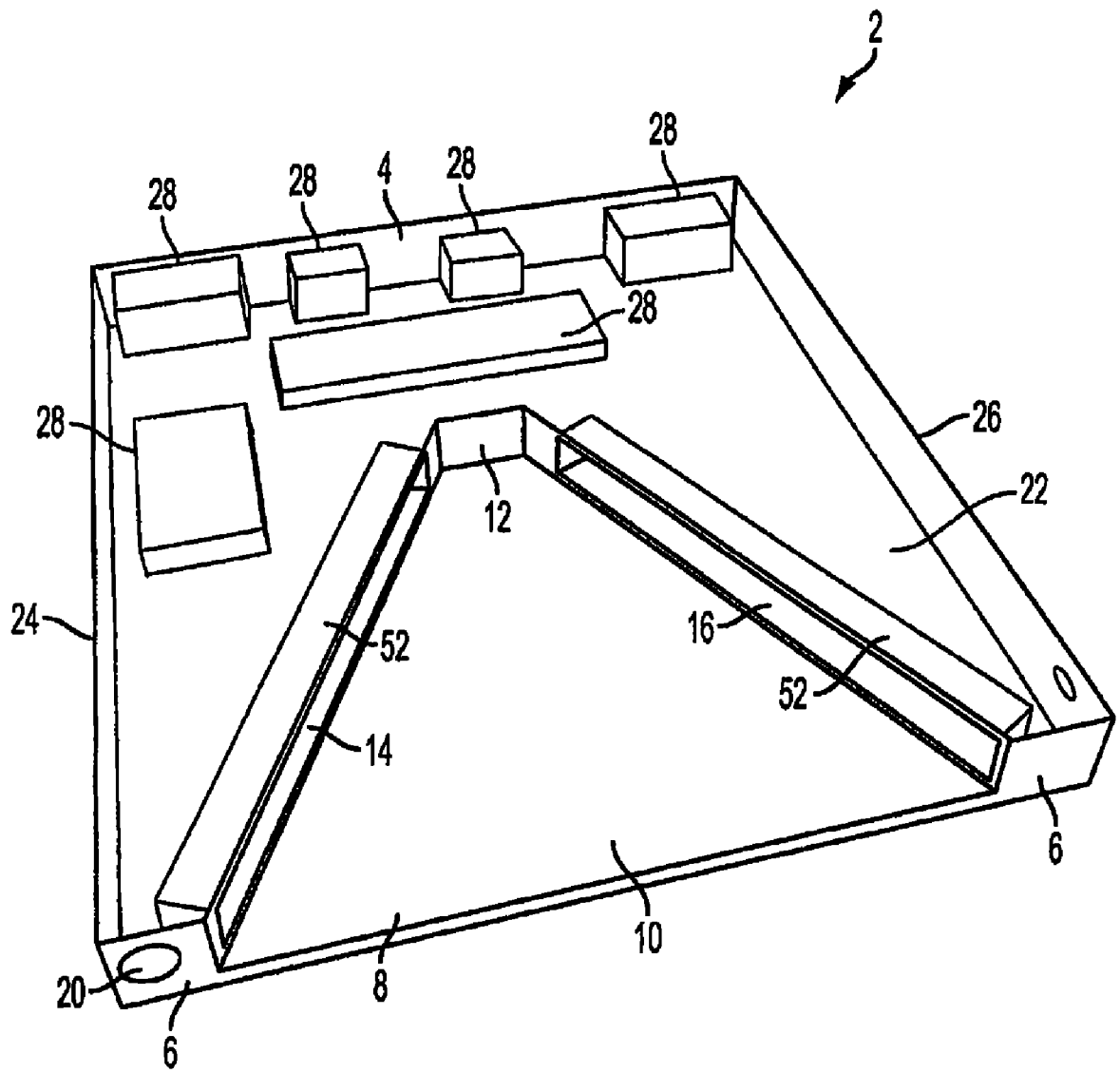
FIG. 1 is a perspective view of a distribution system according to an embodiment of the present invention.
Figure 2:
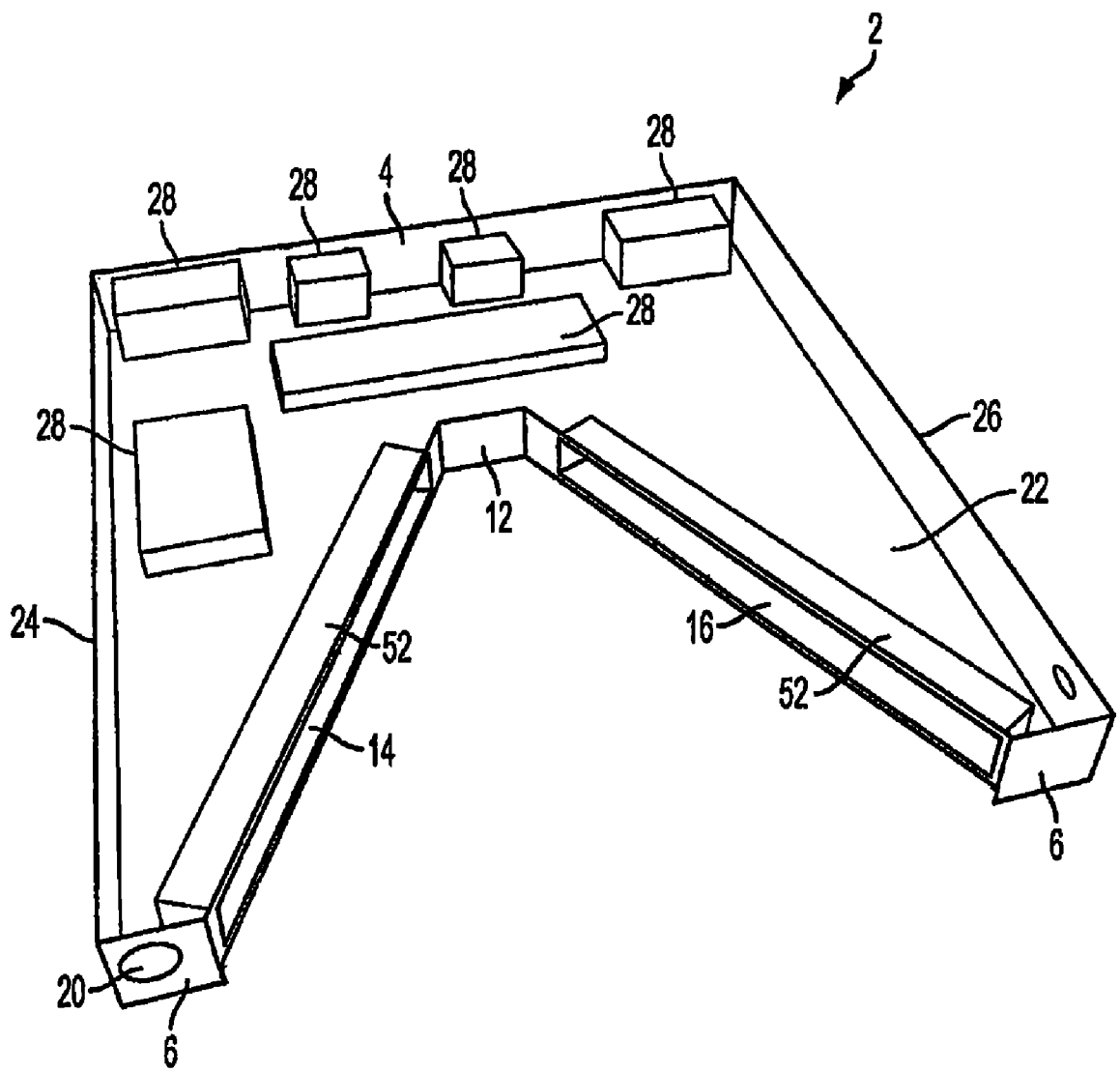
FIG. 2 is a perspective view of the distribution system of FIG. 1 according to an embodiment of the present invention.

FIGS. 1, 2, 3 and 4 are perspective views of a power distribution unit according to an embodiment of the present invention. Referring simultaneously to FIGS. 1-4, power distribution unit 2 includes a first side 4, a second side 6, a third side 24, a fourth side 26, a top portion 22, a bottom portion (interchangeably, base section) 8, a distribution portion 10, a first distribution wall 12, a second distribution wall 14, a third distribution wall 16, component receptacles 28 and 52, and connection 20. Power distribution unit 2 may also include a cable management bar connected between elements 6 as shown in FIG. 2. Cable management bar can be the same height as elements 6 and may include a number of holes or openings. Each hole allows the passage of a cable that is connected to power distribution unit 2. Cable management bar prevents cable entanglement at the rear of the power distribution unit 2.

First distribution wall 12, second distribution wall 14, and third distribution wall 16 form distribution portion 10. In the embodiment of FIGS. 1-4, distribution portion 10 is in the shape of a trapezoid to increase the surface area allocated to the ports. The increased surface area enables substantially more ports to be used with each power distribution unit. In addition, the trapezoidal arrangement improves and enhances cable management as the cables associated with adjacent ports can be formed into bundles. It should be noted that the trapezoidal shape represents only one embodiment of the disclosure. Other shapes which maximize the surface allocated to the distribution walls, or ultimately increase the number of available ports, can be used without departing from the principles of the disclosure.

In one embodiment, distribution wall 12 is configured to communicate 120 V power at each port 18 of distribution wall 12, while distribution walls 14 and 16 are configured to communicate 208 V and 240 V, respectively. The distribution walls can also provide different current output at each segment. Alternatively, each segment or distribution wall may provide a different power output phase (i.e., single phase and three phase options).

FIGS. 1 and 2 show an embodiment having optional component receptacles 52 positioned along second distribution portion wall 14 and third distribution portion wall 16. Component receptacles 52 can house additional ports 18 as needed. FIG. 1 shows connection 20 which can be used to feed wires directed to component receptacles 52.

In one embodiment, ports 18 are power plug outlets, and in another embodiment, ports 18 are electronic connections. Electronic connections may include, among others, USB connections, firewall connections, cable connections, or any other type of connections or any other type of ports. For a 1 U power distribution unit 2, each of the second and third distribution portion walls 14 and 16 can have a total of 13 or more ports 18. For a 2 U power distribution unit 2, each of the second and third distribution portion walls 14 and 16 can have a total of 25 or more ports 18.

Each of the first, second or third distribution wall can be configured to support a number of ports 18. In the exemplary embodiments of FIGS. 1-4, each of second distribution wall 14 or third distribution wall 16 may have a greater number of ports than first distribution wall 12. Second distribution wall 14 may support an equal number of ports 18 as third distribution wall 16. It should be noted that while the exemplary embodiments of FIGS. 1-4 use distribution walls to support ports 18, the disclosure is not limited thereto. In other words, ports 18 may be positioned on (or integrated with) base section 8 without requiring a distribution wall.

In an exemplary embodiment, at least one receptacle 52 on second distribution wall 14 or receptacle 52 on third distribution wall 16 houses at least 13 ports. In another embodiment, at least one of receptacle 52 on second distribution portion wall 14 or receptacle 52 on third distribution portion wall 16 houses at least 25 ports. In one embodiment, first distribution wall 12 can have one or more ports.

In the embodiment of FIGS. 1-4, distribution walls 12, 14 and 16 form a contiguous, V-shaped section which forms a right-angle with base section 8. In another embodiment of the disclosure, the first, second and third distribution walls may be disconnected from each other. The distribution walls may also form an acute angle with base section 8. By forming a trapezoidal shape 10 along base section 8, component receptacle 52 which resides along second distribution wall 14 and third distribution wall 16 can encompass an expanded area. The expanded area allows more ports 18 to be housed by power distribution 2.

Figure 4:
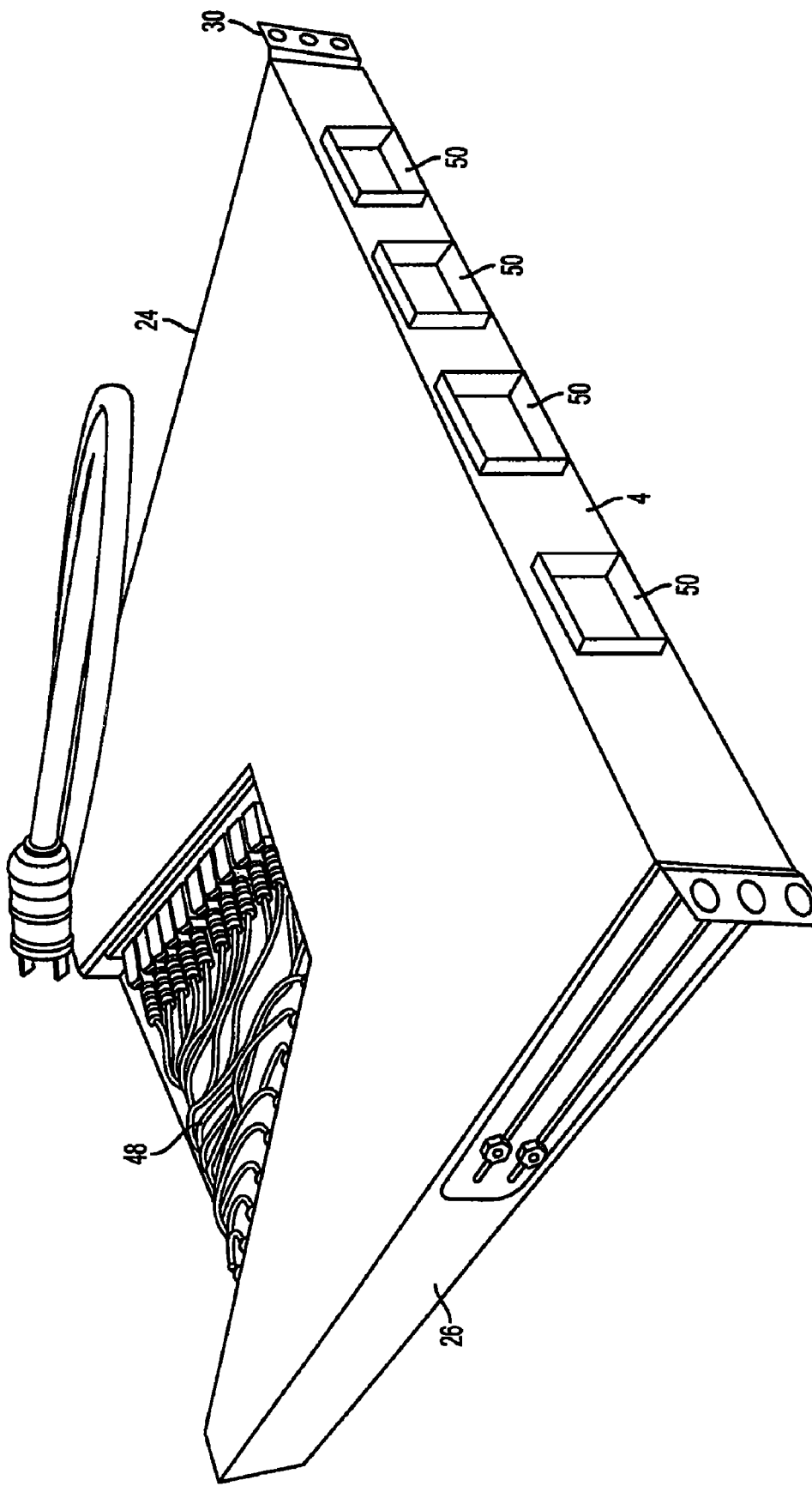
FIG. 4 is a perspective view of the distribution system of FIG. 1 according to an embodiment of the present invention.

FIG. 4 shows cables 48 connected to ports 18. Cables 48 can be, for example, IEC C14 or any power cord (IEC C13 is the female plug and IEC C14 is the male plug). Since more ports 18 can be housed in a single location, cables 48, which connect to ports 18, can be easily located. Furthermore, by having cables 48 connected to ports 18 in a single location, there is less likelihood of cables 48 becoming entangled with each other as they are less likely to be strung haphazardly from different locations along power distribution system 2. Since ports 18 are housed in a single central location, it is less likely that cables 48 can become tangled with each other or with other objects. Furthermore, by having the configuration of the present invention, it is less likely that cables 48 can be accidentally or inadvertently disconnected from ports 18.

For example, if cables 48 were connected at first side 4, cables 48 may have to be routed to second side 6 for connecting to other components. This could cause cables 48 to be entangled with themselves or other objects as they are being routed to second side 6. Furthermore, cables 48 could become disengaged, from ports 18 along first side 4. In addition, if cables 48 become entangled with other objects, cables 48 could inadvertently move power distribution unit 2 or cause power distribution unit 2 to have a sudden impact upon a foreign surface causing damage to power distribution unit 2.

Figure 3:
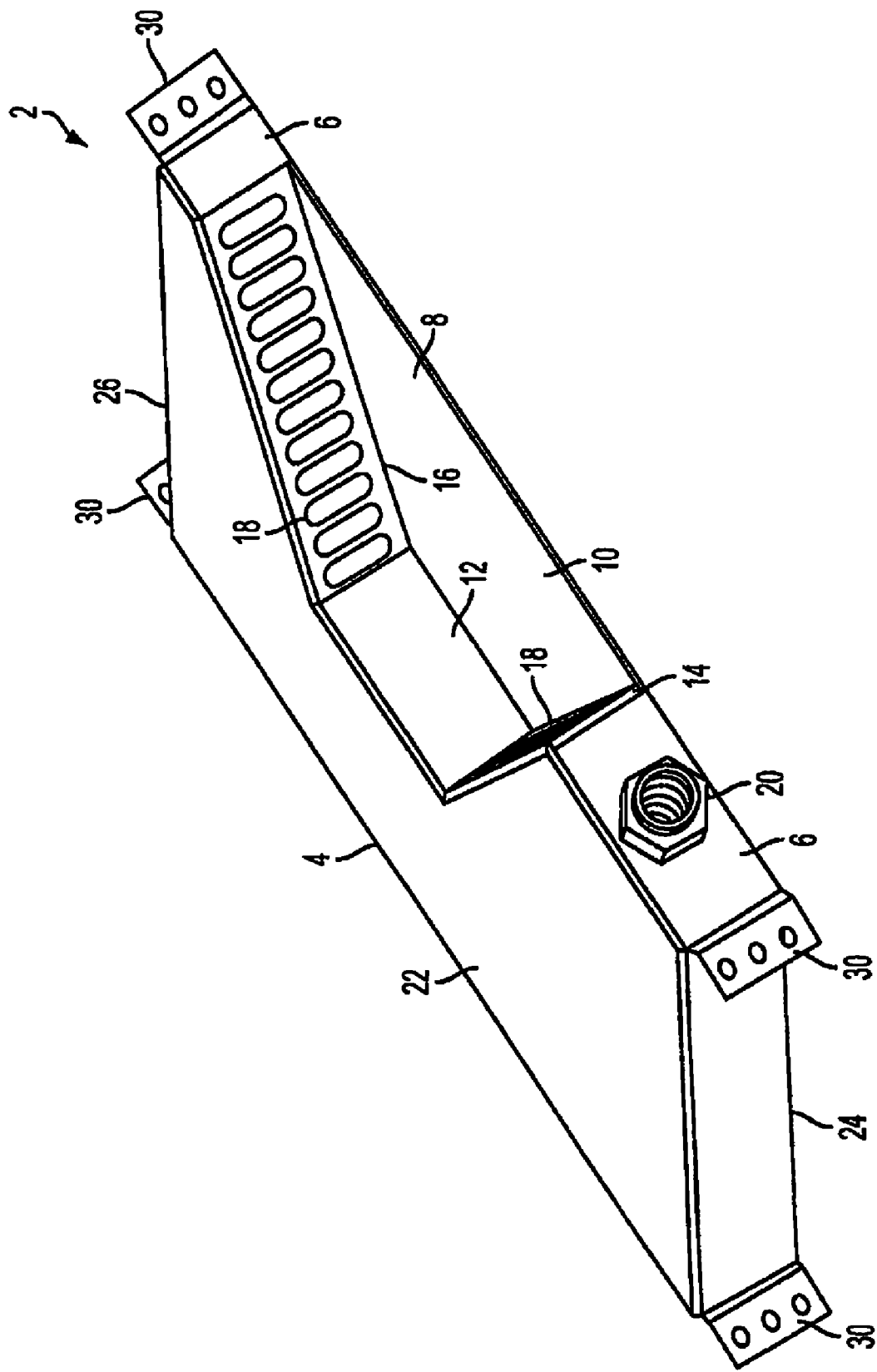
FIG. 3 is a perspective view of the distribution system of FIG. 1 according to an embodiment of the present invention.

Referring again to the embodiment of FIGS. 1-3, connection 20 is located in wall 6. Connection 20 could be a master power plug or any other type of ports such as serial ports, Ethernet ports, and/or environmental ports. A fuse box (not shown) or a breaker (not shown) may be arranged in the proximity of connection 20 to provide surge protection for the circuit. In one embodiment of the disclosure, connection 20 may also includes a locking mechanism to prevent accidental disconnection of the main power supply from power distribution system 2. In the exemplary embodiment of FIG. 3, connection 20 includes a bolt for securely receiving an incoming line.

Component receptacles 28 can be used to house components such as circuit breakers, meters, serial ports, Ethernet ports, and/or environmental ports, etc. Component port 52 can be used to receive the distribution walls (12, 14, 16) and/or connection ports 18. In one embodiment of the disclosure, first distribution wall 12 is covered with a bracket instead of ports to allow easy access to receptacles situated at the far end of distribution system 2. In still another embodiment of the disclosure, a display unit is provided on the power distribution unit to display data. The displayed data may include power setting, time, environmental factors (e.g., temperature) or any other attribute of the power distribution unit's operation.

FIG. 4 shows mounting brackets 30 which allow securing distribution system 2 to a housing, a rack or any other support structure. Mounting brackets 30 allow a plurality of distribution systems 2 to be received at a rack infrastructure. The distribution systems can be mounted to the rack horizontally or vertically. When used with a data system, distribution system 2 can be integrated into a rack infrastructure to house multiple data distribution systems on one rack to thereby consolidate functionality that is typically performed by multiple conventional units.

Power distribution unit 2 can also define one or more processor circuits in communication with a memory circuit for controlling input/output through ports 18. In an exemplary embodiment, power distribution system 2 can be used as part of a data server and ports 18 define one or more USB (or similar) data ports. Component receptacles 28 can house I/O control circuits for controlling data transmission through each of the multiple ports. In still another embodiment, component receptacles 28 are configured to receive cooling devices such as electro-mechanical fans for cooling power distribution system 2.

Figure 8:
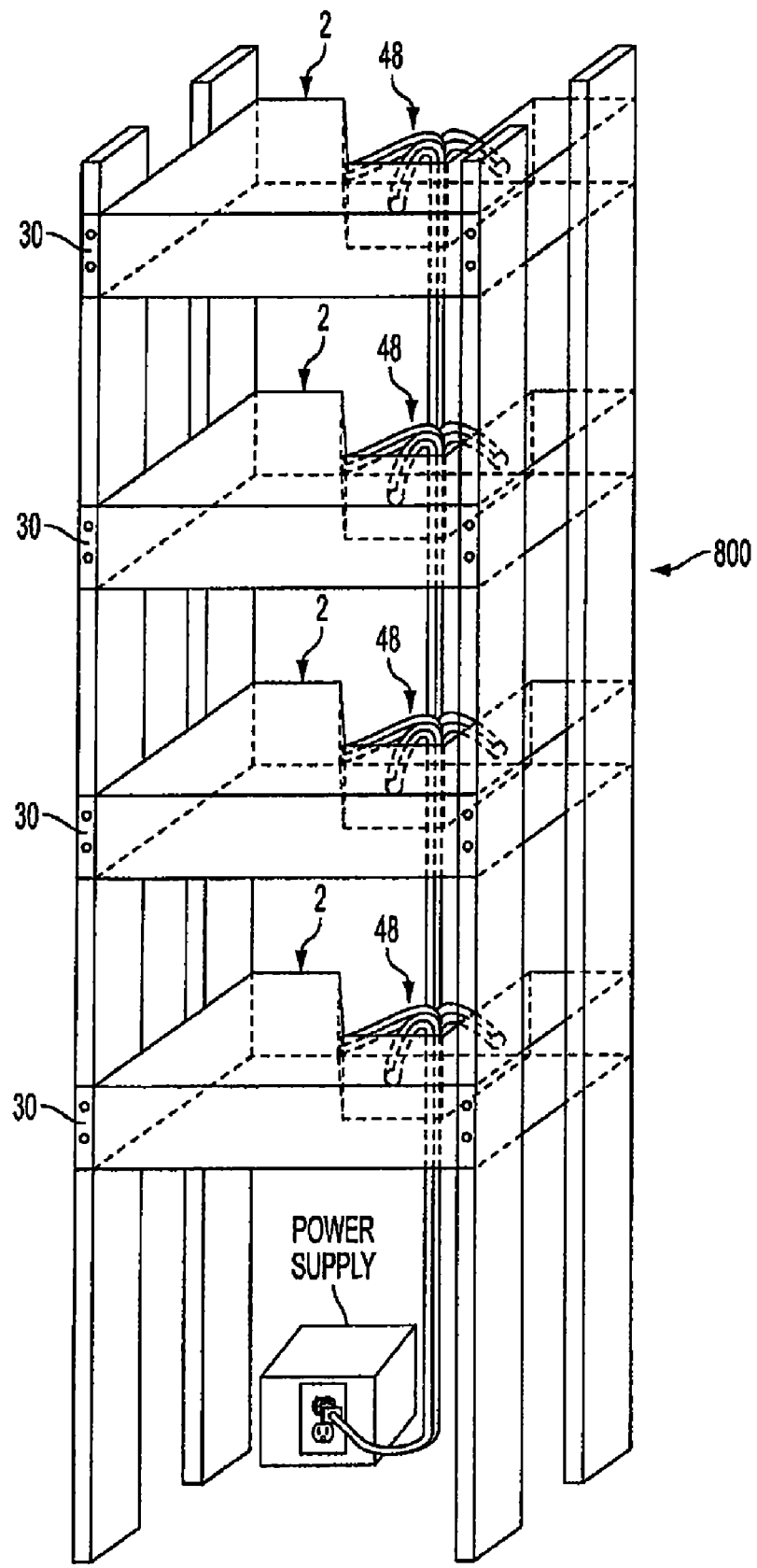
FIG. 8 is a perspective view of a rack holding several power distribution systems according to an embodiment of the present invention.

In an exemplary embodiment defined by a rack having a plurality of power distribution units 2, at least one of the power distribution units can be used to control operation of the other units in the rack. If the power distribution units are used primarily as data distribution hubs, then the designated controller unit can be used to control the Input/Output from each of ports 18 in each distribution unit 2. For example, FIG. 8 shows one embodiment using a rack 800 to store multiple power distribution systems 2 by using brackets 30 to secure each power distribution system 2. As shown in FIG. 8, the power distribution systems 2 may be connected with one another via the cables 48.

Figure 5:
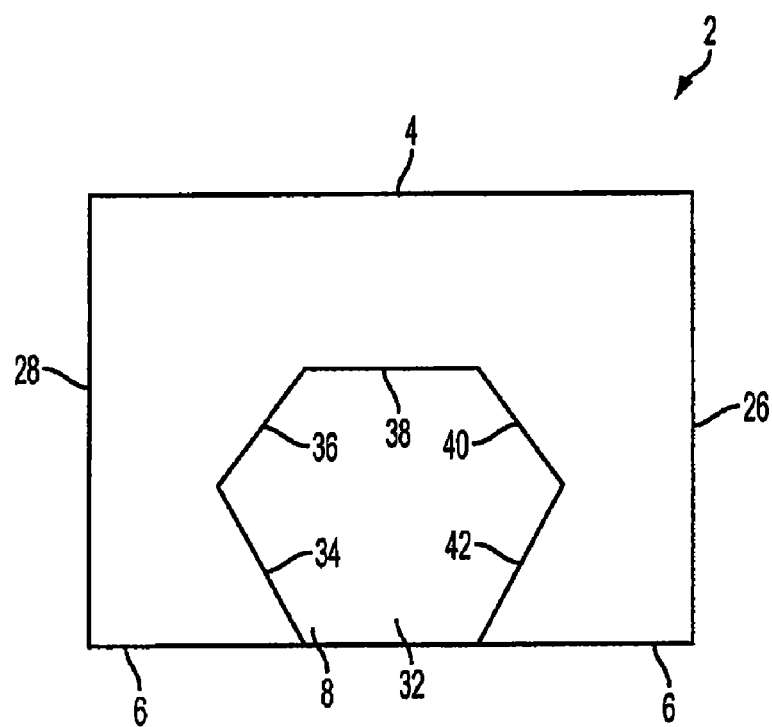
FIG. 5 is a top view of an alternative distribution system according to an embodiment of the present invention.

FIG. 5 is a top view of an alternative power distribution unit according to an embodiment of the present invention. In FIG. 5, power distribution unit 2 has a distribution portion 32 formed in a hexagonal shape along bottom surface 8. Distribution portion 32 is formed by sides 34, 36, 38, 40 and 42. As shown, sides 34 and 36 may form an acute angle or a right angle, whereas sides 36 and 38 may form an obtuse angle. Similarly, sides 40 and 42 may form an acute angle or a right angle, whereas sides 38 and 40 may form an obtuse angle.

Figure 6:
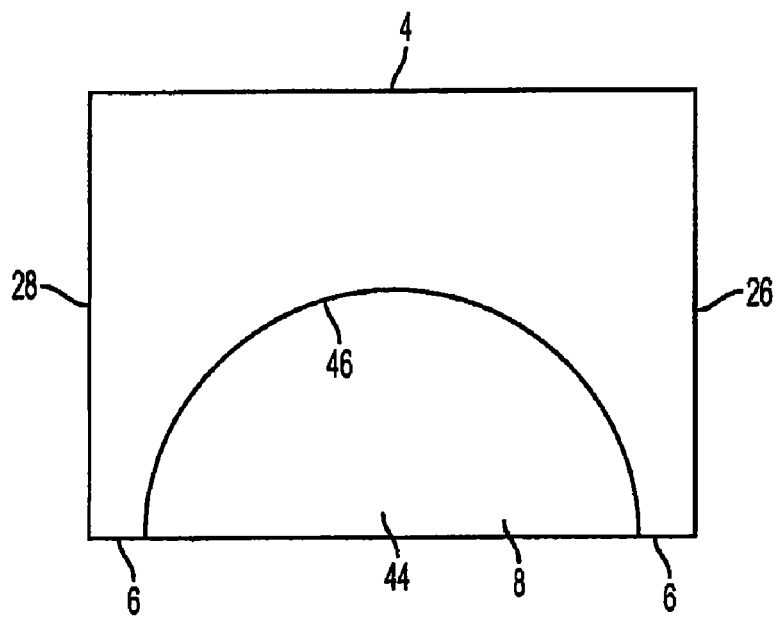
FIG. 6 is a top view of an alternative distribution system according to an embodiment of the present invention.

FIG. 6 is a top view of an alternative power distribution unit according to an embodiment of the present invention. As seen in FIG. 6, power distribution unit 2 has a distribution portion 44 formed in a curved (e.g., semi-circle or an arc) shape along bottom surface 8. Distribution wall 44 is formed by a curved segment 46.

Figure 7:
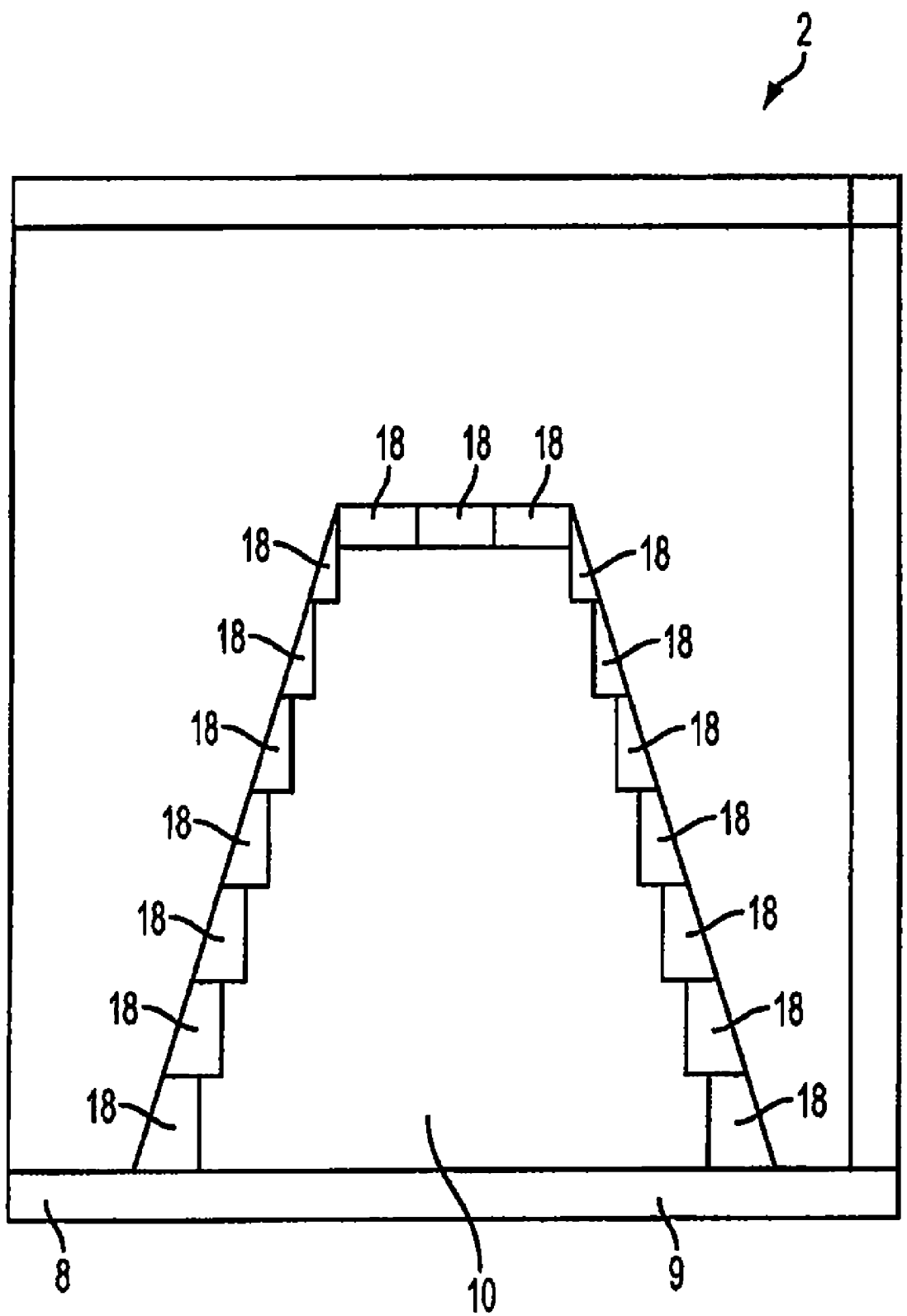
FIG. 7 is a schematic representation of another embodiment of the present invention.

FIG. 7 is a schematic representation of another embodiment of the disclosure. Power distribution unit 2 of FIG. 7 is defined by a base portion 8 supporting a plurality of ports 18. Each of the plurality of ports 18 is positioned on the base such that the face portion of the port is substantially parallel to the edge 9 of the base section. In this manner, connecting and disconnecting from ports 18 would be easier.

While the principles of the disclosure have been illustrated in relation to the exemplary embodiments shown herein, the principles of the disclosure are not limited thereto and include any modification, variation or permutation thereof.

What is claimed is:

1. A cable management housing, comprising:
   a distribution wall having a plurality of ports, the distribution wall further having a top edge located on a first plane and a bottom edge located on a second plane, the second plane being substantially parallel to the first plane, the distribution wall further having a first side edge coupling the top edge of the distribution wall to the bottom edge of the distribution wall, and a second side edge coupling the top edge of the distribution wall to the bottom edge of the distribution wall, wherein a distance between the first side edge of the distribution wall and the second side edge of the distribution wall along the distribution wall defines a length of the distribution wall; and
   an outer wall non-parallel to the distribution wall, the outer wall having a top edge located on the first plane and a bottom edge located on the second plane, the outer wall further having a first side edge coupling the top edge of the outer wall to the bottom edge of the outer wall, and a second side edge coupling the top edge of the outer wall to the bottom edge of the outer wall, wherein a distance between the first side edge of the outer wall and the second side edge of the outer wall along the outer wall defines a length of the outer wall, wherein the length of the outer wall is greater than the length of the distribution wall.

2. The cable management housing of claim 1, further comprising:
   an additional distribution wall having a plurality of ports, the additional distribution wall coupled to the distribution wall forming a distribution portion; and
   an additional outer wall coupled to the outer wall forming a outer wall portion, the outer wall portion and the distribution portion forming a perimeter of the cable management housing.

3. The cable management housing of claim 2, further comprising:
   a top section; and
   a bottom section, wherein the top section, bottom section, distribution portion and the outer wall portion form an enclosure of the cable management housing.

4. The cable management housing of claim 3, wherein at least one of plurality of ports of the distribution wall is configured to allow connection to an electronic device located within the enclosure of the cable management housing.

5. The cable management housing of claim 3, wherein the bottom section is substantially parallel to the top section, further wherein the bottom section has a larger surface area than the top section.

6. The cable management housing of claim 1, wherein the first side edge of the distribution wall is the first side edge of the outer wall.

7. The cable management housing of claim 6, wherein the second side edge of the distribution wall is the second side edge of the outer wall.

8. The cable management apparatus, comprising:
   a distribution wall having one or more panels and a plurality of ports, the plurality of ports substantially covering a surface of the distribution wall;
   an outer wall having one or more panels forming a continuous, closed perimeter with the one or more panels of the distribution wall, wherein each of the panels of the outer wall is non-parallel to at least one panel of the distribution wall; and
   an electronic device, the electronic device located within the continuous, closed perimeter and being coupled to the at least one of the plurality of ports.

9. The cable management apparatus of claim 8, wherein each of the panels of the outer wall is non-parallel to each of the panels of the distribution wall.

10. The cable management apparatus of claim 8, wherein each panel of the distribution wall includes a set of ports.

11. The cable management apparatus of claim 10, wherein each port within the same panel is parallel with every other port within the same panel.

12. The cable management apparatus of claim 11, wherein ports of different panels are non-parallel.

13. The cable management apparatus of claim 11, wherein ports of different panels are on different geometric planes.

14. The cable management apparatus of claim 10, wherein each port within the same panel is on a same geometric plane with every other port within the same panel.

15. A cable management housing, comprising:
   a continuous non-distribution wall having a first side edge and a second side edge, the continuous non-distribution wall further having a top edge spanning a distance between the first side edge and the second side edge along a length of the continuous non-distribution wall; and
   a distribution wall sharing the first side edge and second side edge of the continuous non-distribution wall and having a length different than the length of the continuous non-distribution wall, wherein at least a portion of the distribution wall is located within a distribution region of the cable management housing, further wherein a boundary of the distribution region of the cable management housing is formed by joining a first portion and a second portion, the first portion being the top edge and the second portion being a straight-line segment between the first side edge and the second side edge.

16. The cable management housing of claim 15, wherein the distribution wall comprises:
   a first distribution panel having a first row of at least two ports on a first geometric plane; and
   a second distribution panel having a second row of at least two ports on a second geometric plane, the second distribution panel coupled to the first distribution panel.

17. The cable management housing of claim 16, wherein the first geometric plane and the second geometric plane are non-parallel.

18. The cable management housing of claim 16, wherein a port of the first row is parallel to an adjacent port of the first row and non-parallel to an adjacent port of the second row.

19. The cable management housing of claim 16, wherein a common edge of the first distribution panel and the second distribution panel form an angle.

20. The cable management housing of claim 15, further comprising:
   a top section located on a top plane, the top section having a perimeter substantially smaller than a perimeter the distribution region of the cable management housing; and
   a bottom section located on a bottom plane, the bottom section having a perimeter substantially coincidental with the perimeter of the distribution region,
   wherein the top plane and the bottom plane are substantially parallel.

* * * * *